(12) United States Patent
He et al.

(10) Patent No.: US 7,510,953 B2
(45) Date of Patent: Mar. 31, 2009

(54) INTEGRATED FET AND SCHOTTKY DEVICE

(75) Inventors: Donald He, Redondo Beach, CA (US);
Ritu Sodhi, Redondo Beach, CA (US);
Davide Chiola, Marina Del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 104 days.

(21) Appl. No.: 11/255,745

(22) Filed: Oct. 21, 2005

(65) Prior Publication Data

US 2006/0035422 A1 Feb. 16, 2006

Related U.S. Application Data

(62) Division of application No. 10/633,824, filed on Aug. 4, 2003, now Pat. No. 6,987,305.

(51) Int. Cl.
*H01L 21/28* (2006.01)
(52) U.S. Cl. ............... 438/570; 257/283; 257/E29.317; 257/E27.068; 257/E29.271
(58) Field of Classification Search ................ 438/259, 438/167, 570, 583
See application file for complete search history.

(56) References Cited

U.S. PATENT DOCUMENTS

| | | | |
|---|---|---|---|
| 3,798,514 A | 3/1974 | Hayashi et al. | |
| 4,262,296 A | 4/1981 | Shealy et al. | |
| 4,300,152 A | 11/1981 | Lepselter | |
| 4,513,309 A | 4/1985 | Cricchi | |
| 4,823,172 A | 4/1989 | Mihara | |
| 4,827,321 A | 5/1989 | Baliga | |
| 4,871,686 A | 10/1989 | Davies | |
| 4,903,189 A | 2/1990 | Ngo et al. | |
| 4,982,244 A | 1/1991 | Kapoor | |
| 5,111,253 A | 5/1992 | Korman et al. | |
| 5,262,668 A * | 11/1993 | Tu et al. ..................... | 257/475 |
| 5,525,829 A | 6/1996 | Mistry | |
| 5,877,528 A * | 3/1999 | So ............................. | 257/341 |
| 5,886,383 A | 3/1999 | Kinzer | |
| 6,049,108 A | 4/2000 | Williams et al. | |
| 6,274,905 B1 | 8/2001 | Mo | |
| 6,307,231 B1 * | 10/2001 | Numazawa et al. ......... | 257/330 |
| 6,351,018 B1 | 2/2002 | Sapp | |
| 6,396,090 B1 | 5/2002 | Hsu et al. | |

(Continued)

FOREIGN PATENT DOCUMENTS

JP 411074514 A 3/1999

(Continued)

OTHER PUBLICATIONS

Japanese Office Action dated Sep. 9, 2009 issued in corresponding Japanese Application Serial No. 2004-227165.

(Continued)

*Primary Examiner*—N Drew Richards
*Assistant Examiner*—Ankush k Singal
(74) *Attorney, Agent, or Firm*—Ostrolenk, Faber, Gerb & Soffen; LLP (57) ABSTRACT

A semiconductor device including a schottky device and a trench type semiconductor switching device such as a MOSFET formed in a common die.

11 Claims, 12 Drawing Sheets

U.S. PATENT DOCUMENTS

| | | |
|---|---|---|
| 6,433,396 B1 | 8/2002 | Kinzer |
| 6,441,454 B2 * | 8/2002 | Hijzen et al. ............... 257/483 |
| 6,529,034 B1 | 3/2003 | Ranjan |
| 6,593,620 B1 | 7/2003 | Hshieh et al. |
| 6,600,194 B2 * | 7/2003 | Hueting et al. ............. 257/331 |
| 6,617,642 B1 | 9/2003 | Georgescu |
| 6,686,614 B2 | 2/2004 | Tihanyi |
| 6,707,101 B2 | 3/2004 | Ranjan |
| 6,762,098 B2 * | 7/2004 | Hshieh et al. ............... 438/269 |
| 6,818,939 B1 | 11/2004 | Hadizad |
| 6,977,208 B2 * | 12/2005 | Chiola ........................ 438/570 |
| 2002/0125541 A1 * | 9/2002 | Korec et al. ................. 257/471 |
| 2002/0134998 A1 | 9/2002 | Van Dalen et al. |
| 2003/0022474 A1 * | 1/2003 | Grover et al. ............... 438/570 |
| 2003/0040144 A1 | 2/2003 | Blanchard et al. |
| 2003/0085422 A1 * | 5/2003 | Amali et al. ................. 257/329 |
| 2003/0207538 A1 | 11/2003 | Hshieh et al. |
| 2004/0119103 A1 | 6/2004 | Thapar |
| 2005/0037579 A1 | 2/2005 | Numazawa et al. |
| 2005/0056893 A1 * | 3/2005 | Hadizad ..................... 257/348 |
| 2006/0255373 A1 * | 11/2006 | Elpelt et al. ................. 257/256 |

FOREIGN PATENT DOCUMENTS

| | | |
|---|---|---|
| JP | 2002-203966 | 7/2002 |
| JP | 02002334997 A | 11/2002 |
| JP | 02003068760 A | 3/2003 |
| JP | 2003-19721 | 7/2003 |
| JP | 2003-197911 | 7/2003 |
| WO | WO 00/42665 | 7/2000 |
| WO | WO 00/51167 | 8/2000 |
| WO | WO 00 51167 | 8/2000 |
| WO | WO 03/021639 | 3/2003 |

OTHER PUBLICATIONS

German Office Action dated Oct. 27, 2004 with English language translation.

* cited by examiner

INTEGRATED FET AND SCHOTTKY DEVICE

RELATED APPLICATION

This application is a division of U.S. patent application Ser. No. 10/633,824 filed Aug. 4, 2003 by Donald He, Ritu Sodhi and Davide Chiola and entitled INTEGRATED FET AND SCHOTTKY DEVICE to which a claim of priority is hereby made and the disclosure of which is incorporated by reference.

FIELD OF THE INVENTION

The present invention relates to a power semiconductor device and more particularly to a power semiconductor device which includes a schottky device and a MOSFET both formed in a common die.

BACKGROUND OF THE INVENTION

A major factor of concern in power applications is power loss. Power loss in power applications may be in large part due to power losses by the power switching devices, such as power MOSFETs, within the power circuit. For example, the power loss associated with the body diode of a power MOSFET is a factor that contributes to the overall power loss of a power circuit.

The high frequency and high current demands of the modern power applications require the reduction of power loss. To prevent power loss from the body diode of a MOSFET it is known to use a schottky device in parallel with the body diode, which turns on at a lower voltage than the body diode to prevent conduction by the body diode of the MOSFET. Co-packaged MOSFET and schottky devices have thus been developed for use in power applications. Such packages, however, are relatively large and exhibit undesirable transient behavior.

SUMMARY OF THE INVENTION

To overcome the drawbacks of the prior art devices a device according to the present invention includes a schottky device and a power MOSFET both formed in a common die. As a result a device according to the present invention is more compact and exhibits less power loss.

A semiconductor device according to the present invention includes a trench type MOSFET and a schottky device both formed in a common die. The trench type MOSFET includes a plurality of trenches each supporting a gate structure. The schottky device includes a schottky barrier that is disposed over and in schottky contact with portions of the top surface of the die. According to an aspect of the present invention, the schottky device includes a plurality of schottky regions each of which is disposed between a group of trenches of the MOSFET device. In a device according to the present invention, a common contact makes contact with the source regions of the MOSFET and the schottky barrier of the schottky device.

According to the first embodiment of the present invention, each schottky region includes a schottky barrier disposed over and in schottky contact with at least one mesa formed in the die. The mesa is adjacent to a trench on either side thereof each of which includes a layer of oxide on its sidewalls and contains a conductive material. In the device according to the first embodiment of the present invention, the schottky barrier extends over the mesa and makes contact with the conductive material in each trench.

According to the second embodiment of the present invention, the schottky barrier in each schottky region of the schottky device does not make contact with the conductive material in the trenches adjacent to the at least one mesa and only makes contact with a portion of the mesa.

According to the third embodiment of the present invention, each schottky region in the schottky device includes a schottky barrier formed over a portion of the top surface of the die. No schottky trenches are used in a device according to the third embodiment of the present invention.

Other features and advantages of the present invention will become apparent from the following description of the invention which refers to the accompanying drawings.

DETAILED DESCRIPTION OF EMBODIMENTS OF THE INVENTION

Figure 1:
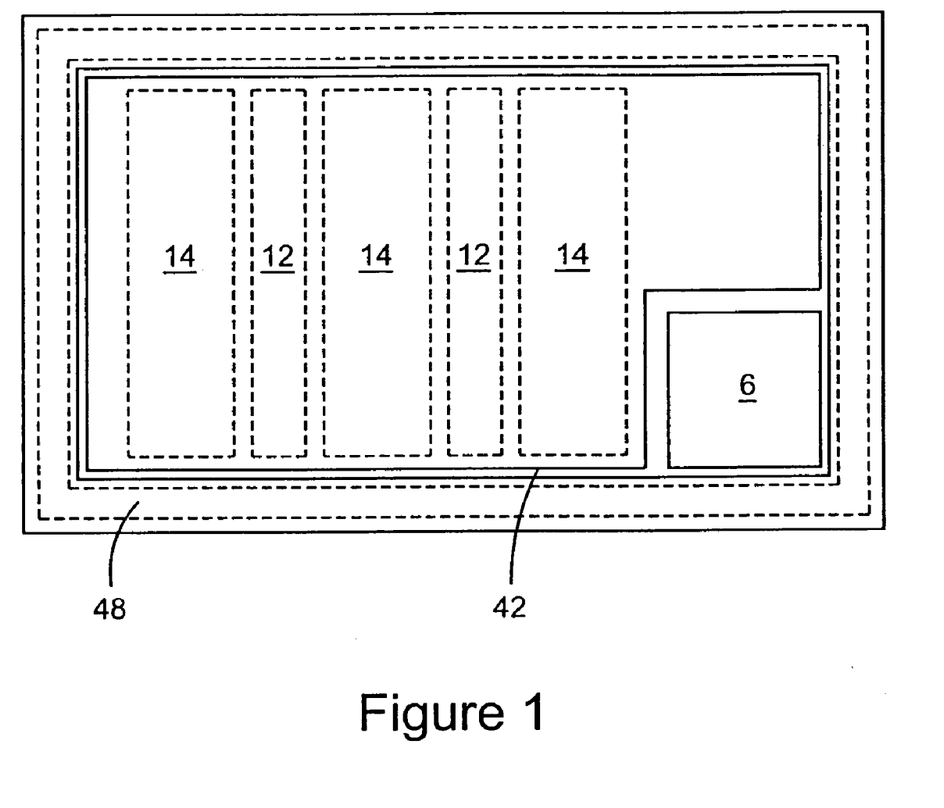
FIG. 1 is a top plan view of a semiconductor device according to the present invention illustrating schematically the arrangement of schottky regions in a semiconductor device according to the present invention.

Referring to FIG. 1, a semiconductor device according to the present invention includes a schottky device and a field effect device formed in a common die thus forming an integrated FET and schottky device. The field effect device in a semiconductor device according to the present invention is a trench type MOSFET. As is known in the art a trench MOSFET includes a plurality of gate structures. Each gate structure is a trench formed in the body of the die and includes a gate oxide layer on its sidewalls and contains a conductive gate material serving as a gate electrode. A typical MOSFET may include a great number of gate structures formed side by side.

A schottky device according to the present invention includes a number of schottky regions 12. According to one aspect of the present invention, the gate structures of the MOSFET are arranged in groups such that each schottky region 12 is adjacent to a group of gate structures 14 as schematically shown by FIG. 1. The groups of gate structures 14 are connected to gate contact 6 by gate runners (not shown) in a known manner so that they are operated in unison to activate the MOSFET.

It should be noted that to illustrate the invention the relative dimensions and numbers of schottky regions 12 and groups of gate structures 14 have been exaggerated. One skilled in the art would recognize that the dimensions and the number of schottky regions 12 and groups of gate structures 14 are a matter of design choice and in typical applications may range in hundreds of thousands or even more.

Figure 2:
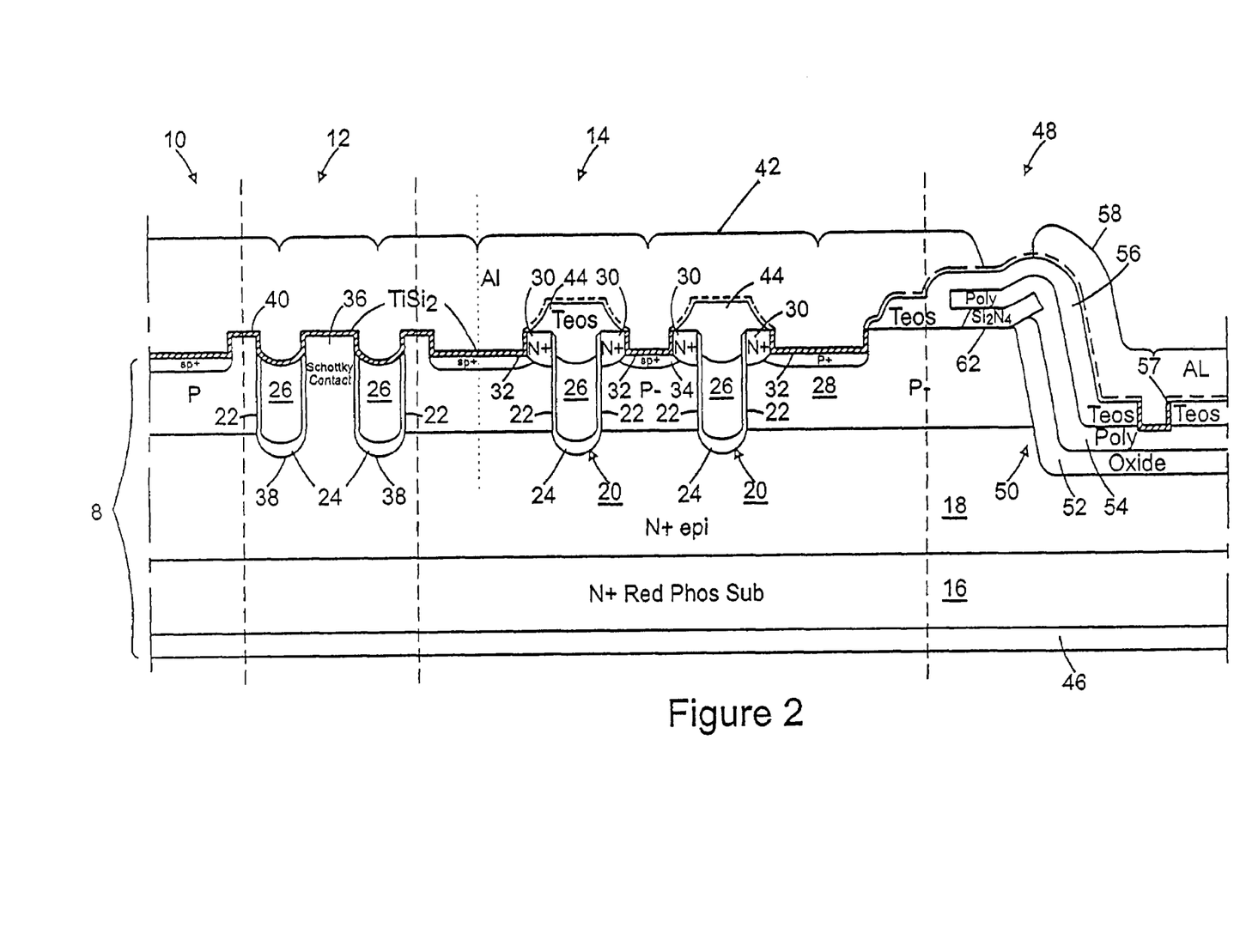
FIG. 2 is a cross-sectional view of a portion of a device according to the first embodiment of the present invention.

Referring to FIG. 2, a semiconductor device 10 according to the first embodiment of the present invention includes at least one schottky region 12 and a field effect device that includes groups of gate structures 14 formed in a common die 8. Die 8 may include a highly doped substrate 16 of one conductivity type and a lightly doped epitaxial layer 18 of the one conductivity type formed over a major surface of substrate 16. Substrate 16 may be doped with red phosphorous although other highly-doped substrates may be used without deviating from the present invention.

The field effect device in semiconductor device 10 according to the first embodiment of the present invention includes a plurality of gate structures similar to gate structures of known trench type devices. According to one aspect of the present invention each group of gate structures 14 is disposed adjacent a schottky region 12 as illustrated by FIG. 2.

Each trench 20 is formed in epitaxial layer 18 and includes gate oxide 22 of an appropriate thickness on its side walls, optionally a thick oxide layer 24 at the bottom thereof, and a conductive material 26 such as polysilicon which serves as a gate electrode in trenches 20.

The field effect device in semiconductor device 10 also includes base region 28, and source regions 30. Base region 28 is formed in epitaxial layer 18 by counter doping of the same with dopants of a conductivity opposite to that of epitaxial layer 18.

Source regions 30 are highly doped regions of the same conductivity type as epitaxial layer 18. Each source region 30 extends from the top surface of die 8 to a predetermined depth inside base region 28 and is disposed adjacent a sidewall of a trench 20.

Each trench 20 extends from the top surface of the die to a depth below base region 28. The areas in base region 28 adjacent to a gate oxide 22 can be inverted by application of an appropriate voltage to conductive material 26 adjacent thereto to form a channel region in base region 28 adjacent the gate structure. Channel regions electrically connect source regions 30 to the regions of epitaxial layer 18 below base region 28 (hereinafter "drift region"), thereby allowing conduction between the two.

In semiconductor device 10 according to the first embodiment of the present invention, depressions 32 are formed between each pair of trenches 20. Also a highly doped region 34 of the same conductivity type as base region 28 is formed at the bottom, and source regions 30 are located at the opposing sidewalls of each depression 32. According to one aspect of the invention, a layer of Ti or $TiSi_2$ is formed over the sidewalls and the bottom surface of each depression 32 to reduce sheet resistance.

In the first embodiment of the present invention, each schottky region 12 includes schottky barrier 40. Schottky barrier layer 40 is preferably composed of $TiSi_2$, although other suitable barrier materials may be used without departing from the spirit of the present invention. Schottky barrier 40 is formed over mesa 36 having two trenches 38 disposed on either side thereof. The sidewalls of each trench 38 is lined with gate oxide 22 and the bottom of each trench 38 optionally includes a thick oxide layer 24. In the first embodiment of the present invention, schottky barrier 40 is formed over and is in schottky contact with the mesa, and a portion of the sidewalls of mesa 36, and the top of conductive material 26 in each trench 38. Extending schottky barrier 40 to the sidewalls of mesa 36 is advantageous in that it increases the schottky active area. It should be noted that schottky regions 12 in a semiconductor device according to the first embodiment of the present invention are not restricted to one mesa 36.

According to an aspect of the present invention, semiconductor device 10 includes contact layer 42 which extends over the top surface of the die and is in electrical contact with schottky barrier 40 and source regions 30 (through $TiSi_2$ layers disposed on the sidewalls of depression 32). Contact layer 42 thus serves both as source contact for the field effect device and the schottky contact for the schottky device in a semiconductor device according to the present invention. It should be noted that contact layer 42 is insulated from conductive material 26 in trenches 20 by insulation plugs 44 which are preferably composed of a low temperature oxide such as TEOS. According to the preferred embodiment of the present invention contact layer 42 is composed of Al, AlSi or AlSiCu.

Semiconductor device 10 also includes termination structure 48, which surrounds (see FIG. 1) the active area (area including schottky device and field effect device). Termination structure 48 includes field oxide layer 52 disposed over the bottom and sidewall of deep depression 50, and polysilicon layer 54 disposed over field oxide layer 52. Deep depression 50 is formed around the active region in semiconductor device 10, and extends to a depth below base region 28, and preferably below the depth of trenches 20 and 38. Termination structure 48 further includes a layer of low temperature oxide 56 which may be TEOS or the like, disposed over polysilicon layer 54, and termination contact 58 disposed over the layer of low temperature oxide 56, and electrically connected to polysilicon layer 54 through access hole 57 in the layer of low temperature oxide 56. Device 10 is not limited to termination structure 48, but may include a conventional termination structure such as a conventional field plate.

In addition, semiconductor device 10 includes bottom contact 46 which serves both as the drain contact for the field effect device and the second contact for the schottky device. Bottom contact 46 may include any suitable conductive structure such as a conventional trimetal structure.

The process for manufacturing device 10 will now be described.

Figure 3:
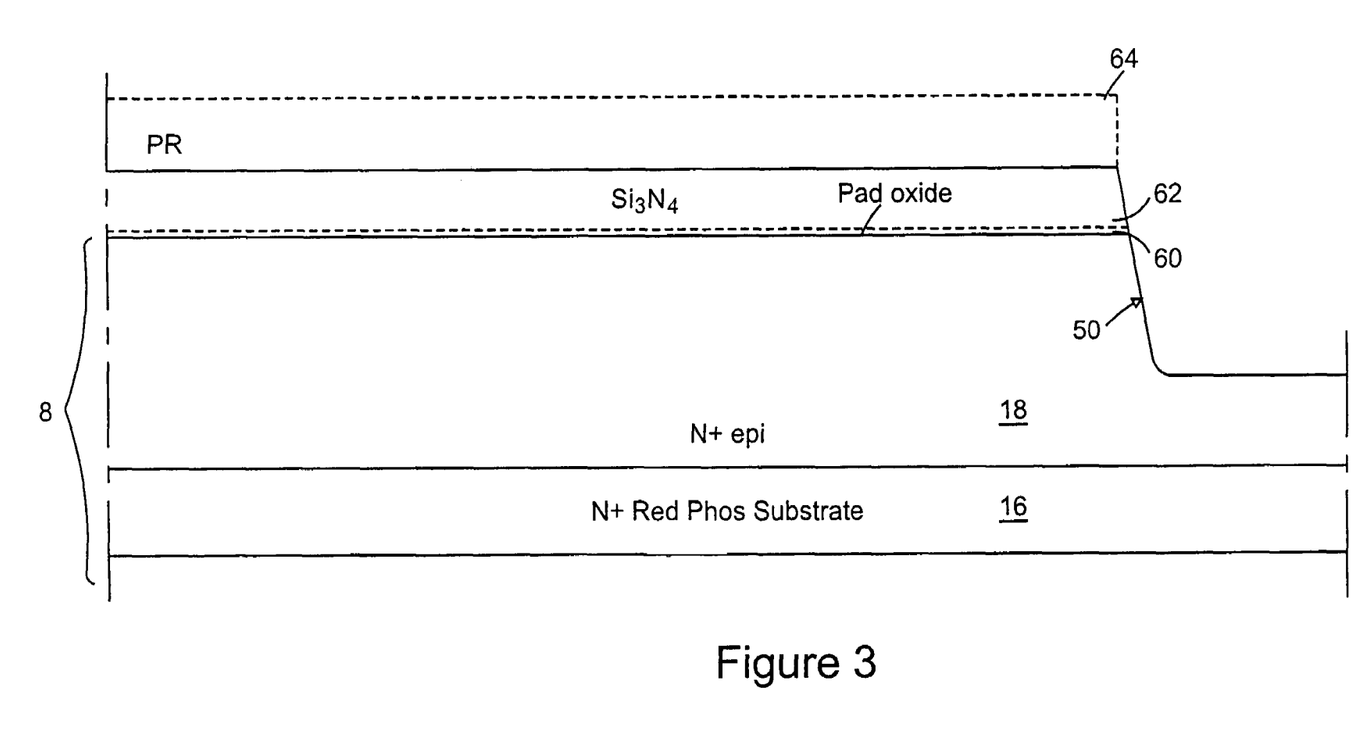
FIGS. 3-7 illustrate the processing steps undertaken to obtain a device according to the first embodiment of the present invention.

Referring first to FIG. 3, starting with die 8, a thin layer (e.g. 230 Å) of pad oxide 60 is grown atop a major surface of die 8. Next, a relatively thicker layer (e.g. 1200 Å) of $Si_3N_4$ 62 is deposited over the layer of pad oxide 60. A layer of photoresist 64 is then deposited over the layer of $Si_3N_4$ 62 and through photolithography deep depression 50 is defined in die 8.

Figure 4:
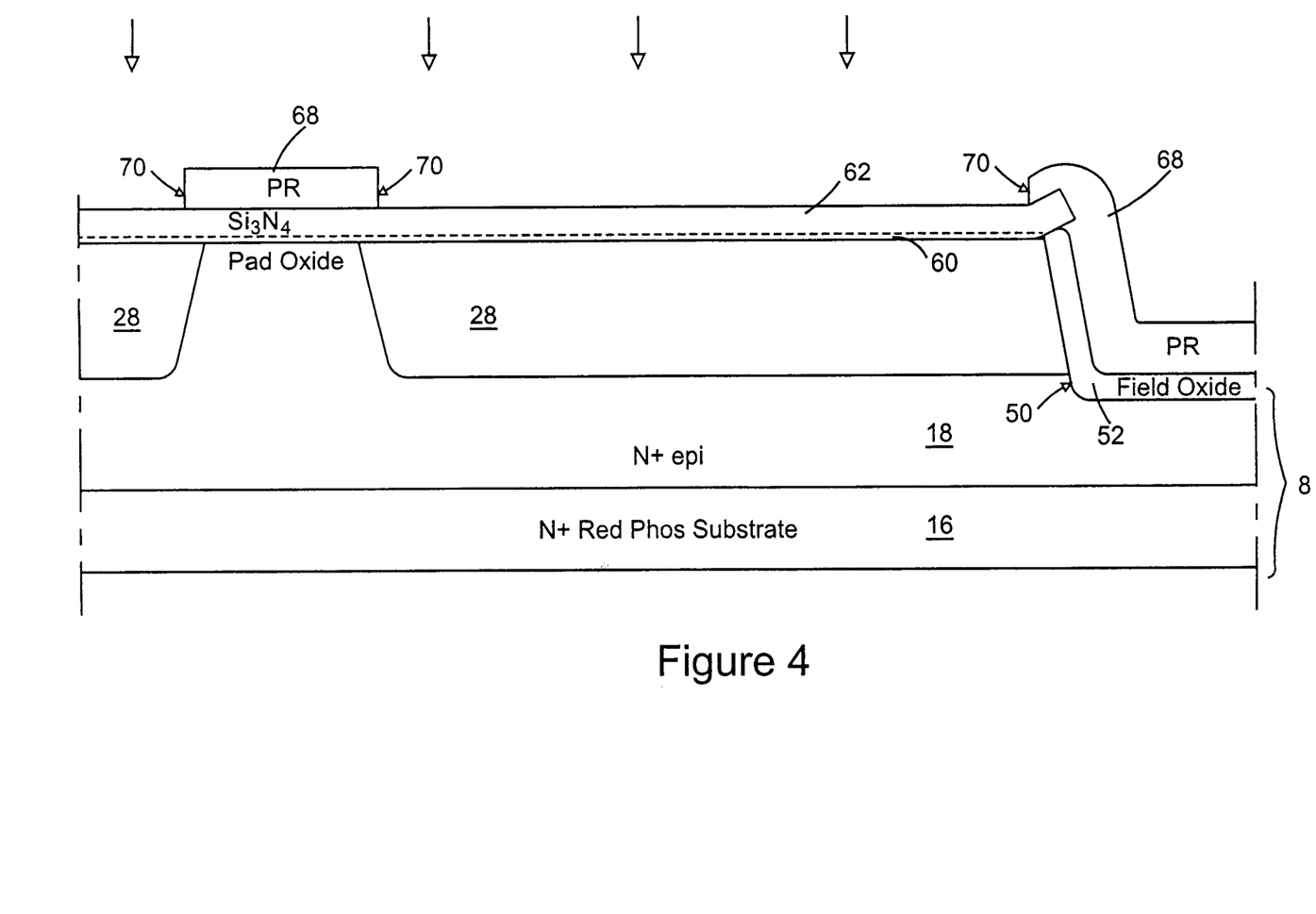

Referring next to FIG. 4, the layer of photoresist 64 is removed and a layer of field oxide 52 is grown over the sidewall and the bottom of deep depression 50. A layer of photoresist 68 is next deposited and processed through photolithography to provide windows 70 over selected portions of the top surface of die 8. Next, dopant atoms of the opposite conductivity type to the conductivity type of die 8 are implanted in the top surface of die 8 through windows 70, the layer of $Si_3N_4$ 62 and pad oxide 60, and driven in a diffusion drive to a desired depth to form laterally spaced base regions 28. Prior to the diffusion drive the layer of photoresist 68 is removed.

Figure 5:
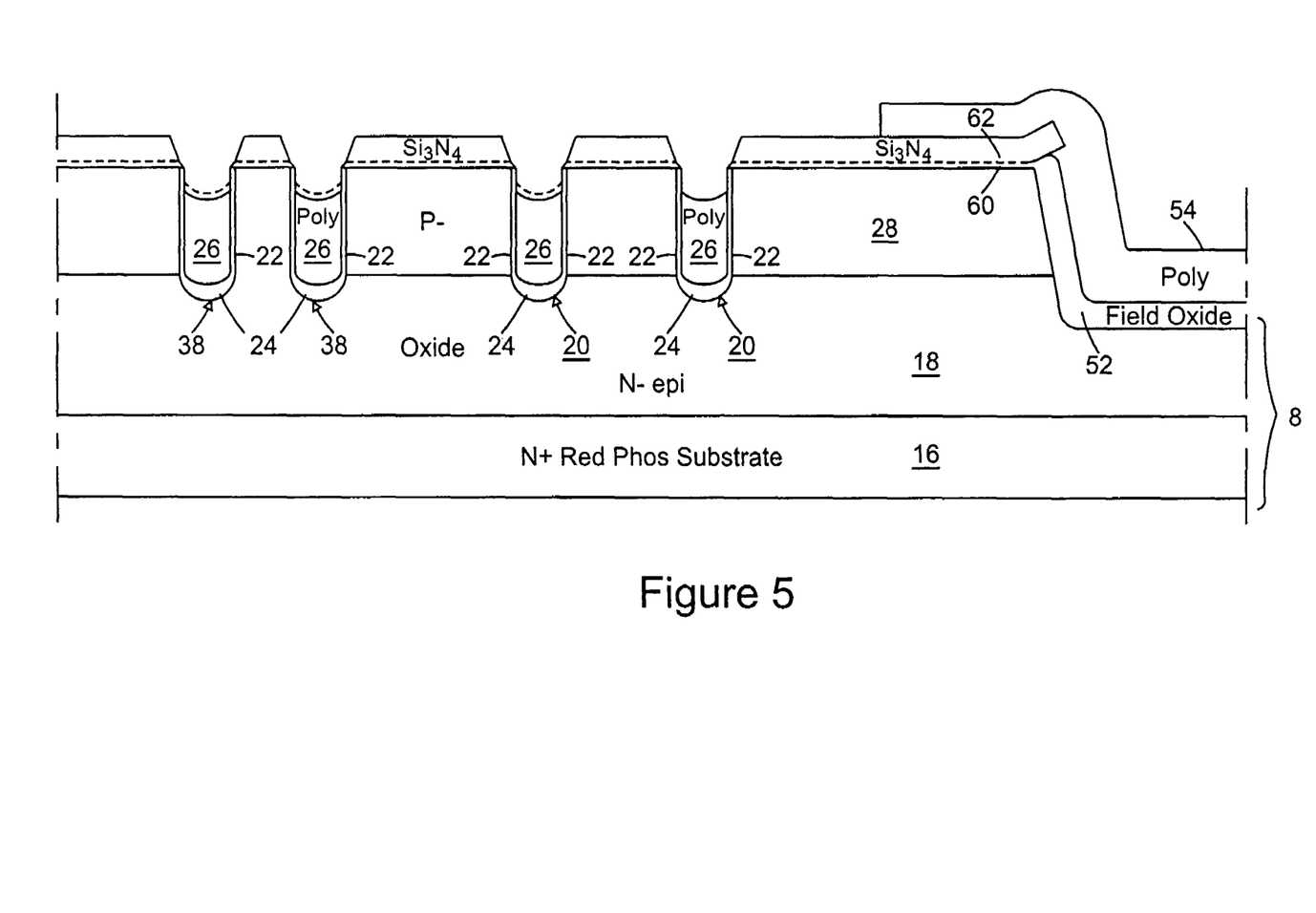

Referring next to FIG. 5, trenches 20, 38 are formed to a depth below base region 28 in die 8 by, for example, photolithography and etch. Next, any leftover photoresist material from the latter photolithographic processing is removed and thick oxide layer 24 on the bottom, and gate oxide layer 22 on the sidewalls of each trench are formed as follows:

First, a sacrificial oxide layer is grown on and removed from the sidewalls and the bottom of trenches 20, 38. Next a layer of pad oxide is grown over the sidewalls and the bottom of trenches 20, 38 followed by the deposition of a layer of $Si_3N_4$ over the pad oxide layer. $Si_3N_4$ at the bottom of each trench 20, 38 is then removed by dry etching and the bottom of each trench 20, 38 is further oxidized to form thick oxide 24 at the bottom of each trench 20, 38. Next, the remaining portion of $Si_3N_4$ is removed from the sidewalls of trenches 20, 38 and gate oxide layers 22 are grown on the sidewalls of the trenches.

Thereafter, a layer of polysilicon is deposited which results in the filling of trenches 20, 38. The polysilicon layer is then etched to leave each trench 20, 38 at least partially filled with polysilicon, and to leave the layer of polysilicon 54 over the layer of field oxide 52. The polysilicon remaining in each trench 20, 38 constitutes a conductive material 26 as described earlier. The top surface of each conductive material 26 may be next oxidized as shown by the broken lines in FIG. 5.

Figure 6:
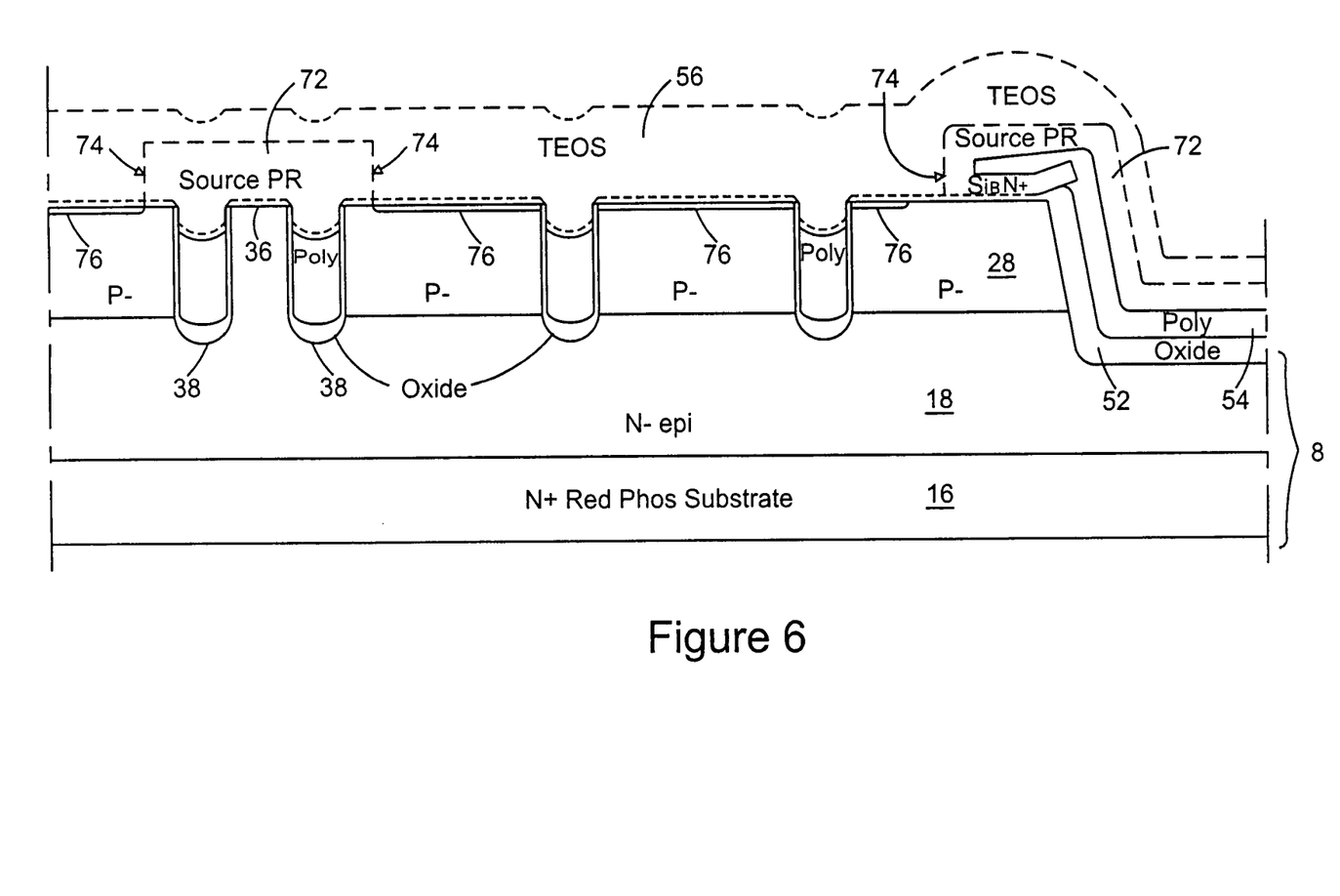

Referring next to FIG. 6, the remainder of $Si_3N_4$ 62 is next removed by wet etching, and photoresist layer 72 is deposited. Photo resist layer 72 is then etched so that an area 74 on the top surface of die 8 is exposed. Area 74 will be the site of the active region for the field effect device as will be seen later. Source dopants of the same conductivity as epitaxial layer 18 (opposite to base layer 28) are then implanted in area 74 to form counter-doped region 76 in base region 28. It should be noted that a portion of photoresist layer 72 is left over mesa 36 and trenches 38 adjacent thereto during the implantation of the source dopants. Photoresist layer 72 is then removed (removal indicated by broken lines) and TEOS 56 is deposited over the entire surface of the structure.

Figure 7:
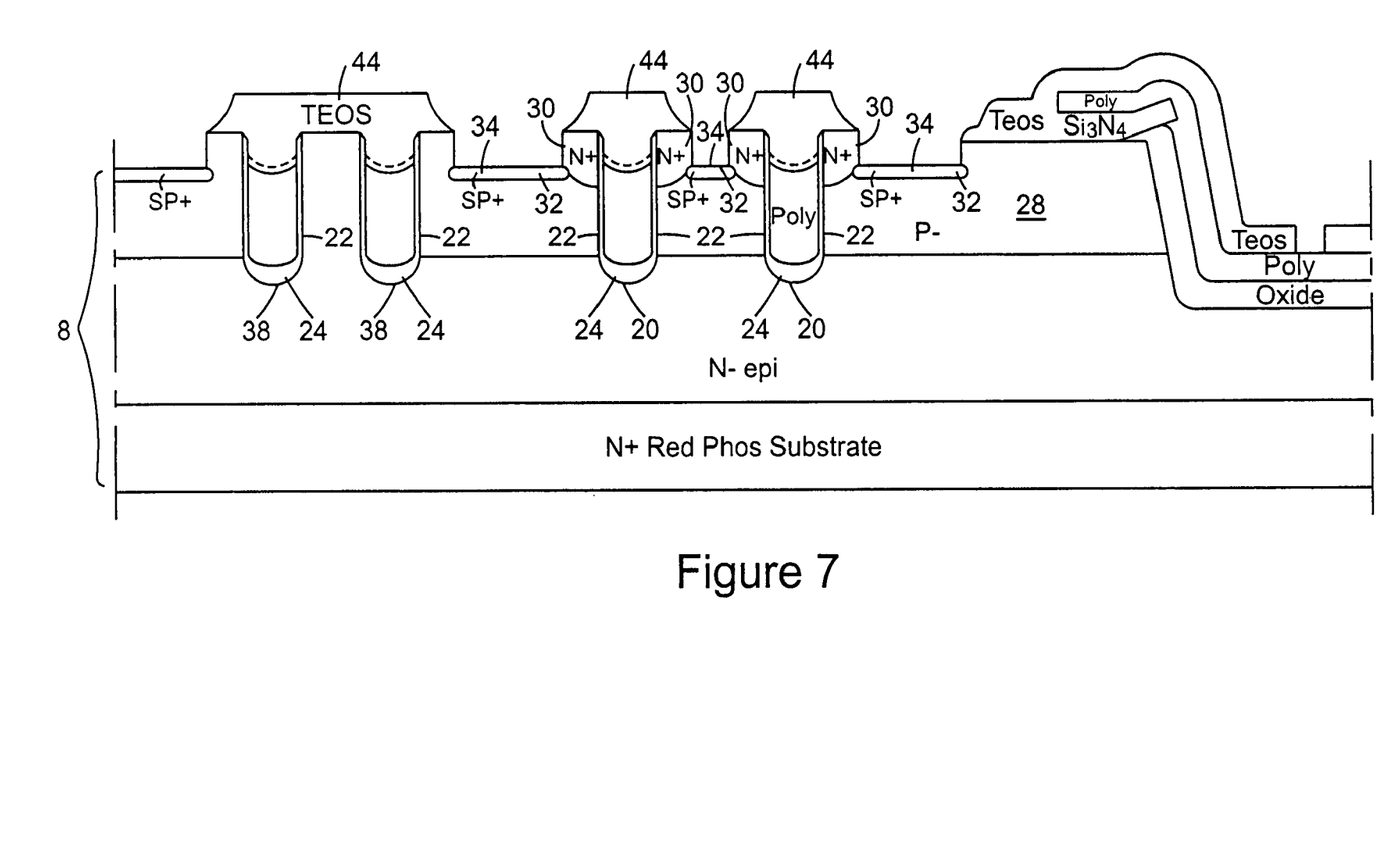

Referring next to FIG. 7, by applying photolithography, depressions 32 are formed in die 8 to a depth below counter-doped region 76 leaving insulation plugs 44 (formed from TEOS 56) over the top of trenches 20, 38. Preferably, insulation plugs 44 are etched to have tapered sidewalls. Next, any remaining photoresist is removed and source dopants are driven in a diffusion drive step to form source regions 30. Dopants of the same conductivity type as base region 28 are then implanted at the bottom of each depression 32 and driven to form high conductivity regions 34.

Referring again to FIG. 2, insulation plug 44 over mesa 36 and trenches 38 adjacent thereto is removed through photolithography. Any photoresist left from the photolithographic step is then removed and a layer of Titanium is deposited and titanium silicide barrier forms by rapid thermal annealing (RTA). Unreacted titanium is then removed from the top of insulation plugs 44 and TEOS layer 56, and a layer of AL is deposited and sintered to form contact layer 42. To obtain device 10 the back contact 46, and gate contact 6 (FIG. 1) are formed according to any conventionally known technique.

Figure 8:
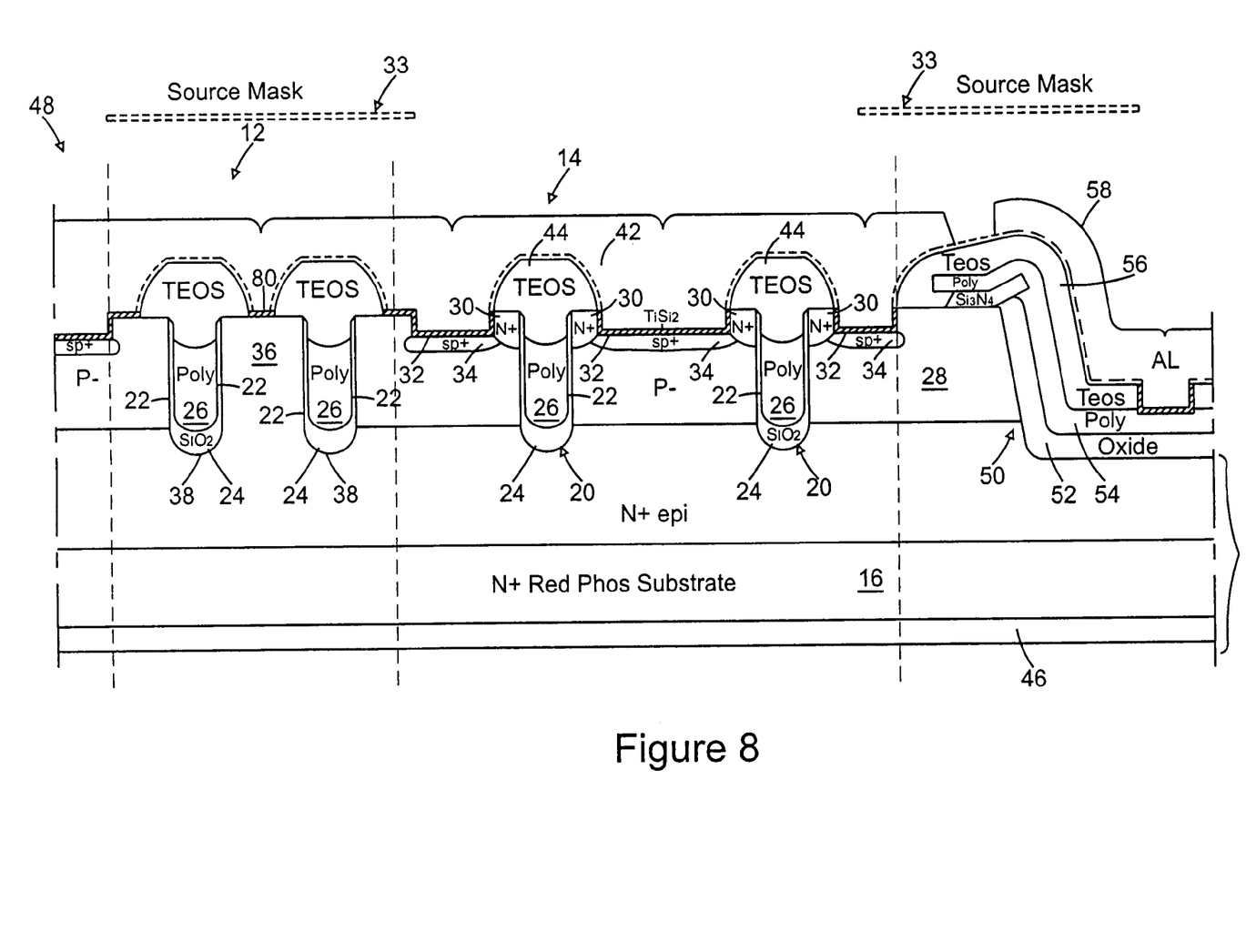
FIG. 8 is a cross-sectional view of a portion of a device according to the second embodiment of the present invention.

Referring to FIG. 8, device 78 according to the second embodiment of the present invention is similar in all respects to device 10 except that the schottky region 12 of device 78 includes schottky barrier 80, which unlike schottky barrier 40 of device 10, only makes contact to the top surface of mesa 36 and does not extend to the sidewalls of trenches 38 and the polysilicon inside trenches 38.

The process for manufacturing device 78 according to the second embodiment has fewer mask steps than the process for manufacturing device 10 according to the first embodiment, and is carried out according to the process described above with reference to FIGS. 3-5 in combination with the following additional steps.

Figure 9:
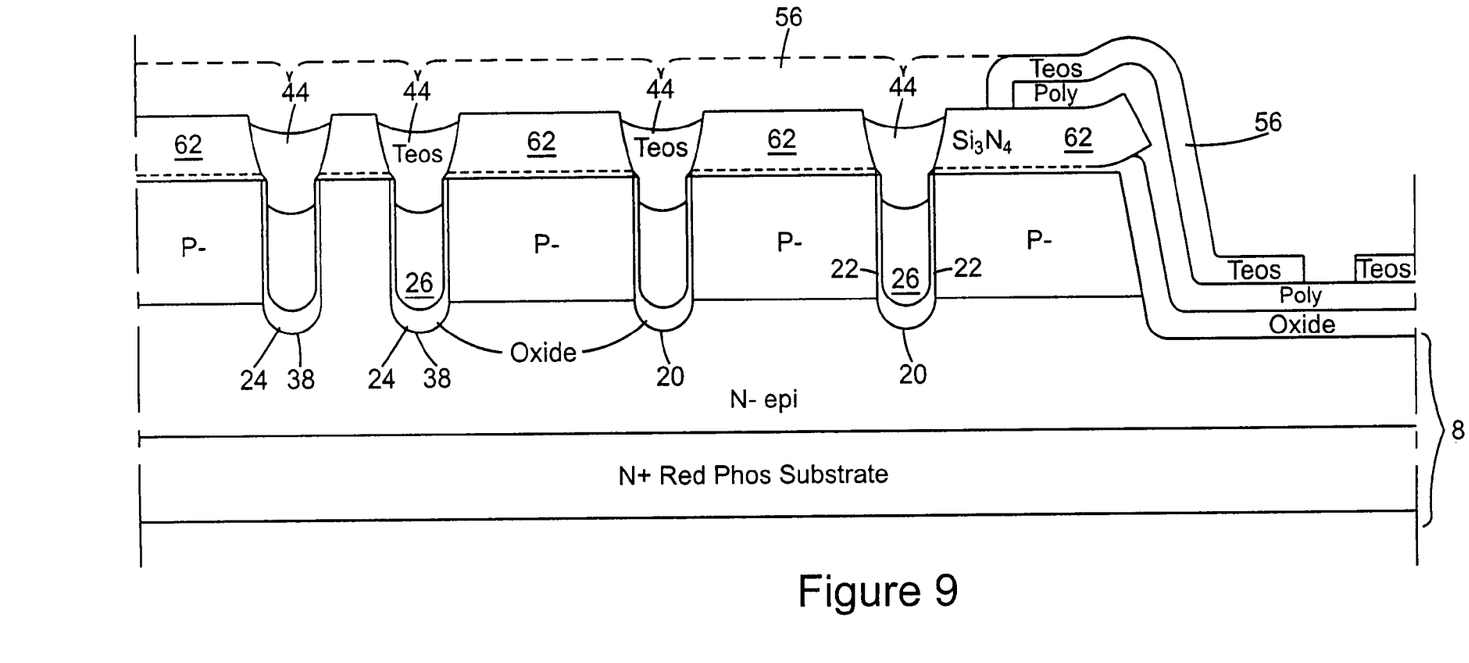
FIGS. 9-10 illustrate the steps undertaken to obtain a device according to the second embodiment of the present invention.

Referring next to FIG. 9, unlike the process set forth above for the manufacturing of device 10 (first embodiment) the layer of $Si_3N_4$ 62 is not removed after the formation of conductive material 26 (i.e., deposition of polysilicon in trenches 20). Rather, without removing the layer of $Si_3N_4$ 62, a layer of TEOS 56 (shown by broken lines) is deposited and densified. Next, by application of photolithography TEOS 56 is removed (removed portion shown by broken lines) until $Si_3N_4$ 62 is exposed leaving insulation plugs 44. It should be noted that similar to the processing of device 10 (first embodiment) a layer of TEOS 56 is left in the termination area.

Figure 10:
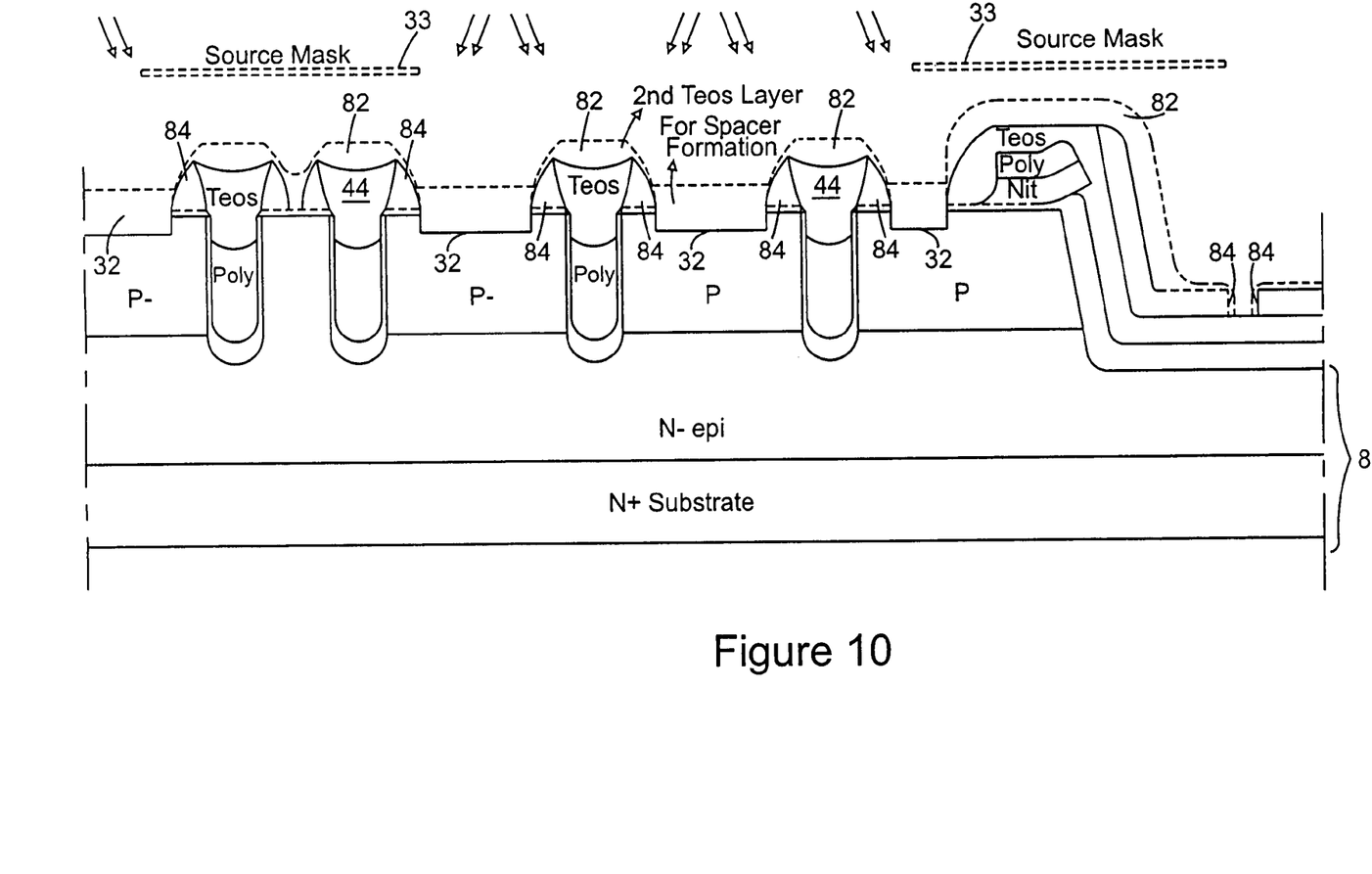

Referring next to FIG. 10, the remaining $Si_3N_4$ is removed by wet etching and a second layer of TEOS 82 (shown by broken lines) is deposited. Then, insulated spacers 84 are formed on the sidewalls of insulation plugs 44 by anisotropic etching of the second layer of TEOS 82. The latter etching step is continued until at least the top surface of die 8 is exposed.

Next, using a source mask 33 source dopants are implanted at an angle. Depressions 32 are then formed on the top surface of die 8 using any appropriate etching method.

Referring again to FIG. 8, dopant atoms of the same conductivity type as that of base region 28 are implanted through the existing source mask 33 at the bottom of each recess 32, and, thereafter driven along with the source dopants to form high conductivity regions 34 and source regions 30 respectively. Next, source mask 33 is removed, and after a cleaning step, a layer of Ti is deposited, subjected to silicidation and appropriately etched to form schottky barrier 80 over the top of mesa 36, and $TiSi_2$ over the surfaces of depressions 32. Contact 42 and bottom contact 46 are then formed in the same manner described above with reference to device 10.

Figure 11:
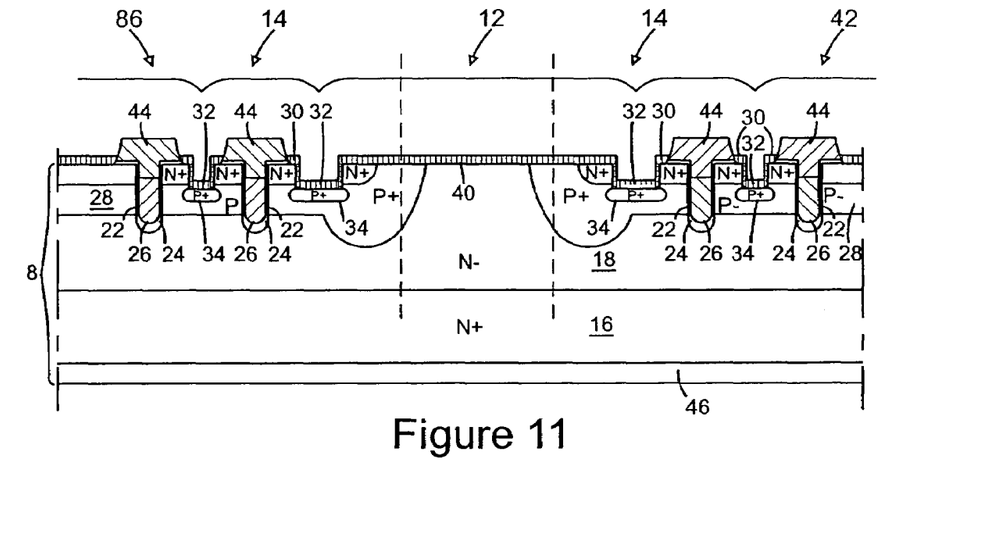
FIG. 11 is a cross-sectional view of a portion of a device according to the third embodiment of the present invention.

Referring to FIG. 11, device 86 according to the third embodiment of the present invention includes all of the features set forth in device 10 (first embodiment) and device 78 (second embodiment) except that schottky region 12 of device 86 is not formed over or on a mesa adjacent to two laterally spaced trenches. Rather, schottky region 12 in device 86 includes schottky barrier layer 40 which is formed over the top surface of a region in epitaxial layer 18 that has not been counter-doped. It should be noted that base region 28 near schottky region 12 of device 86 is deepened and more highly doped (regions 92) relative to the rest of base region 28 in order to reduce electric field stress and increase breakdown voltage. It should also be noted that counter-doped regions 90 are laterally spaced from one another, and each includes at a lateral edge thereof a region 92 which extends deeper into epitaxial layer 18 and is more highly doped relative to the rest of counter-doped regions 90

Device 86 according to the third embodiment of the present invention is manufactured according to the following process.

Figure 12:
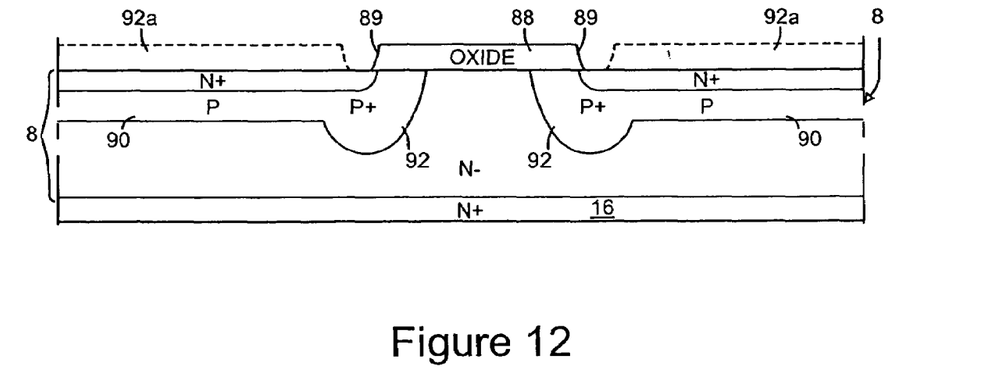
FIG. 12-15 illustrate the steps undertaken to obtain a device according to the third embodiment of the present invention.

Referring first to FIG. 12, a layer of oxide is formed over the top surface of die 8. Next through photolithography and etch, portions of the layer of oxide are removed to open windows 89 in the layer of oxide to form layer of oxide 88 (solid line) and layer of oxide 92a (broken line), and expose part of the top surface of epitaxial layer 18 in window 89 area. Implanting through the window 89, counter-doped regions 92 are formed in epitaxial layer 18. Then a photoresist layer is formed over layer of oxide 88 and layer of oxide 92a is removed to expose part of the top surface of epitaxial layer 18. Using layer of oxide 88 (not removed by photolithography and etch) as a mask counter-doped regions 90 are formed in epitaxial layer 18. Thereafter, source dopants are implanted in the counter-doped regions 90 using layer of oxide 88 as a mask. It should be noted that source dopants are implanted to a depth less than the depth of the counter-doped regions 90. It should also be noted that counter-doped regions 90 are merged with counter-doped regions 92 as shown in FIG. 12.

Regions 92 extend deeper into epitaxial layer 18 than regions 90 and through a drive step laterally extend to areas below layer of oxide 88.

Figure 13:
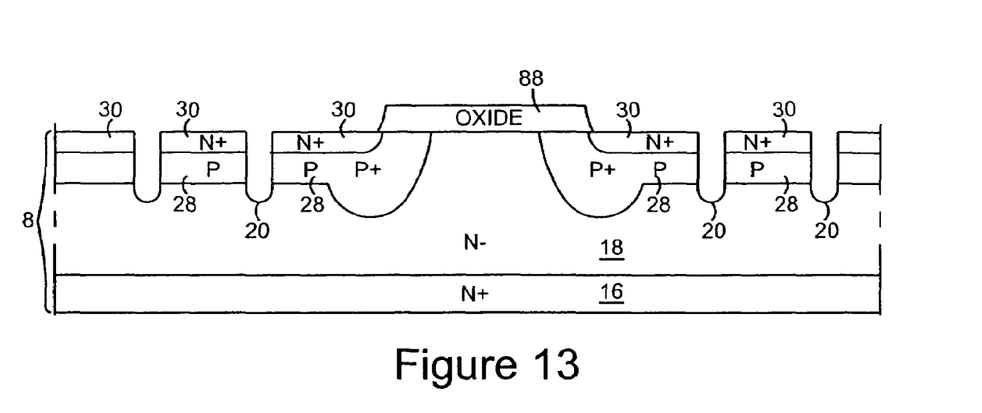

Referring to FIG. 13, preferably counter-doped regions 90 and regions containing source dopants are driven in a diffusion drive to form base region 28, and source regions 30. Trenches 20 are then formed through photolithography to obtain the structure shown in FIG. 13.

Figure 14:
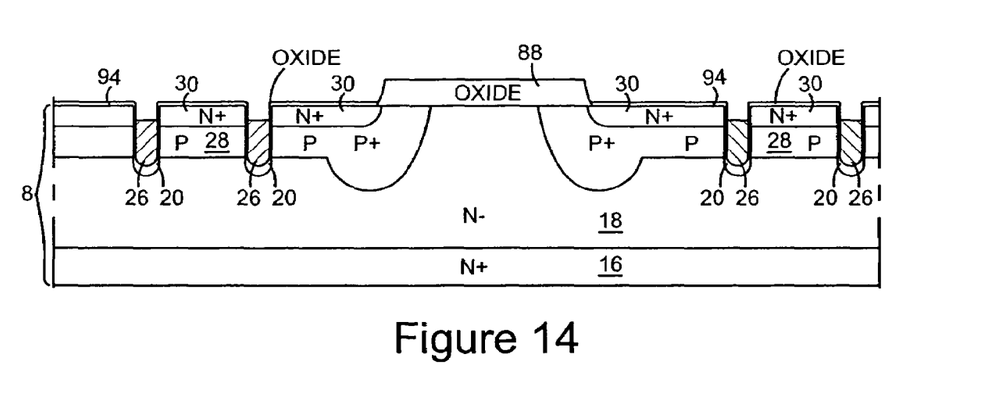

Referring to FIG. 14, a layer of oxide 94 is grown atop the structure shown by FIG. 13 including the sidewalls and bottom of each trench 20. It should be noted that the process may be modified to obtain trenches 20 having thick oxide bottoms similar to device 10 (first embodiment) and device 78 (second embodiment). After forming the layer of oxide 94, a layer of polysilicon is deposited, and then etched enough (along with any underlying oxide) to leave each trench 20 partially filled with polysilicon (conductive material 26) which will serve as a gate electrode.

Figure 15:
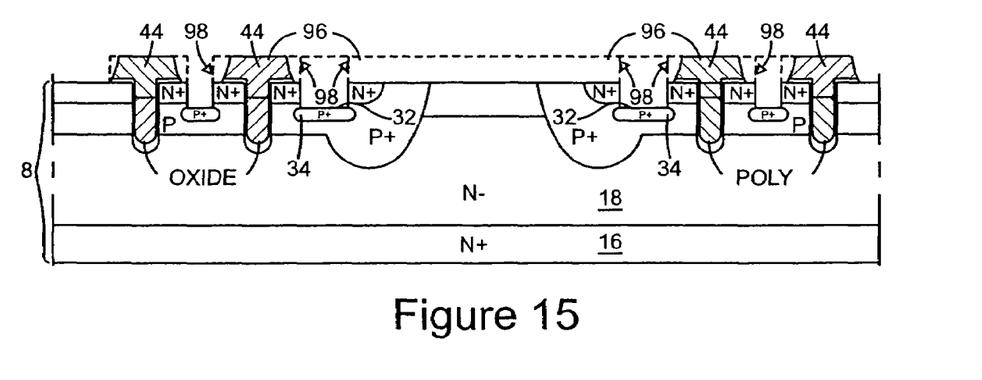

Referring next to FIG. 15, the rest of oxide 88 layer is then removed and a layer of TEOS 96 (shown by broken lines) is then deposited over the structure shown by FIG. 14. Next, openings 98 (shown by vertical broken lines) are opened in the layer of TEOS 96 to expose certain portions of the top surface of epitaxial layer 18, which portions are etched to create depressions 32. Thereafter, dopants of the same conductivity type as base region 28 are implanted at the bottom of each depression 32 and driven in a diffusion drive to form high conductivity regions 34. Insulation plugs 44 are then formed by the removal of selected portions of TEOS 96 (removed portions shown by broken lines) through, for example, photolithography.

Referring again to FIG. 11, a layer of Ti is deposited over the structure shown by FIG. 15 by, for example, sputtering and then annealed to form $TiSi_2$ which serves as the barrier material for schottky barrier 40 over that region of epitaxial layer 18 between laterally spaced base regions 28. It should be noted that $TiSi_2$ may also extend over the sidewalls and the bottom of each depression 32. Next, excess $TiSi_2$ is removed from the top of insulation plugs 44 and contact layer 42 is sputtered on. Bottom contact 46 is then deposited over the bottom of die 8 to form device 86 according to the third embodiment of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for manufacturing a semiconductor device, comprising:
   providing a semiconductor die of one conductivity type;
   forming a termination trench in said semiconductor die;
   forming a mask over a portion of said semiconductor die;
   forming laterally spaced base regions of another conductivity type in said semiconductor die by implanting dopants of said another conductivity type into regions of said semiconductor die not covered by said mask, said base regions being spaced from one another by a region of said one conductivity disposed below said mask;
   forming spaced trenches after forming said base regions through said base regions to serve as gate trenches for a semiconductor switching device;
   forming a schottky device over said region of said one conductivity type between said base regions;
   forming source regions in said base regions adjacent said trenches; and
   forming a common first contact in contact with said schottky device and said source regions wherein said termination trench extends to a depth below said gate trenches, and is formed in a step independent of a step for forming said gate trenches.

2. A method according to claim 1, wherein said semiconductor switching device is a trench MOSFET.

3. A method according to claim 1, wherein said schottky device includes a schottky barrier comprised of $TiSi_2$.

4. A method according to claim 1, further comprising a trench on each side of said region of said one conductivity between said base regions, each trench having an oxide formed on its sidewalls and containing a conductive material, wherein said schottky device includes a schottky barrier in schottky contact with said region of said one conductivity and said conductive material.

5. A method according to claim 3, wherein said schottky device includes a schottky barrier.

6. A method for manufacturing a semiconductor device, comprising:
   providing a semiconductor die of one conductivity type;
   forming a mask over a portion of said semiconductor die;
   forming laterally spaced base regions of another conductivity type in said semiconductor die by implanting dopants of said another conductivity type into regions of said semiconductor die not covered by said mask, said base regions being spaced from one another by a region of said one conductivity disposed below said mask;
   forming spaced trenches after forming said base regions through said base regions to serve as gate trenches for a semiconductor switching device;
   forming a schottky device over said region of said one conductivity type between said base regions;
   forming source regions in said base regions adjacent said trenches; and
   forming a common first contact in contact with said schottky device and said source regions.

7. A method according to claim 6, wherein said semiconductor switching device is a trench MOSFET.

8. A method according to claim 6, wherein said schottky device includes a schottky barrier comprised of $TiSi_2$.

9. A method according to claim 6, further comprising a trench on each side of said region of said one conductivity between said base regions, each trench having an oxide formed on its sidewalls and containing a conductive material, wherein said schottky device includes a schottky barrier in schottky contact with said region of said one conductivity and said conductive material.

10. A method according to claim 6, further comprising forming a region of another conductivity between each base region and said region of said one conductivity, said region of another conductivity extending to a depth below said base region.

11. A method according to claim 6, further comprising a trench on each side of said region of said one conductivity between said base regions, each trench having an oxide formed on its sidewalls and containing a conductive material.

* * * * *